(12) United States Patent
Pfaff

(10) Patent No.: US 6,294,920 B1
(45) Date of Patent: Sep. 25, 2001

(54) TEST MOUNTING FOR SURFACE MOUNT DEVICE PACKAGES

(76) Inventor: Wayne K. Pfaff, 309 Steeplechase, Irving, TX (US) 75062

( * ) Notice: Subject to any disclaimer, the term of this patent is extended or adjusted under 35 U.S.C. 154(b) by 0 days.

(21) Appl. No.: 09/327,432

(22) Filed: Jun. 7, 1999

(51) Int. Cl.[7] .............................. G01R 31/02; G01R 31/26
(52) U.S. Cl. ......................... 324/755; 324/754; 324/757; 324/761; 324/765
(58) Field of Search ................................... 324/755, 754, 324/757, 761, 765; 439/266

(56) References Cited

U.S. PATENT DOCUMENTS 5,419,710 * 5/1995 Pfaff ...................................... 439/266
5,508,628 * 4/1996 Pfaff ...................................... 324/755

* cited by examiner

Primary Examiner—Safet Metjahic
Assistant Examiner—Anjan K Deb
(74) Attorney, Agent, or Firm—Dennis T. Griggs

(57) ABSTRACT

A test mounting for LGA packages uses curved contact fingers to make electrical contact between lands on the LGA package and surface mount circuitry on a circuit board or the like. The mounting includes a guide member with guide apertures therein spaced from a support base with corresponding guide apertures. A bending plate positioned between the guide plate and the support base is moved laterally with respect thereto to increase or decrease the distance between the ends of each contact finger and thereby connect or disconnect the ends of the contact fingers with an LGA package mounted adjacent the guide plate and circuit pads on a circuit board on which the test mounting is mounted.

11 Claims, 3 Drawing Sheets

TEST MOUNTING FOR SURFACE MOUNT DEVICE PACKAGES

This invention relates to burn-in and test of electronic devices in surface mount packages. More particularly, it relates to methods and apparatus for mounting and holding electronic device packages during burn-in and test and to establishing and maintaining positive electrical contact to closely spaced input/output terminal lands or leads on such packages without damaging the electronic device, the device package, its interconnection terminals or the test socket and without introducing signal distortion.

Advances in microelectronics technology tend to develop electronic device chips and packages which occupy less space while performing more functions faster. As a result, the number of electrical interconnections between the device package and external circuitry required for the circuits in the chips to communicate with the outside world increases and the physical size of each such interconnection must decrease. In order to provide electrical communication between the chip and external circuitry, circuit chips are usually contained within a housing or package which supports interconnection pads or lands, leads, balls, etc., on one or more of its external surfaces. In order to reduce overall lead length from chip to external circuitry and to provide adequate spacing between input/output terminals on the package, high pin count devices are sometimes mounted in packages in which the input/output terminals are in the form of conductive lands or pads formed on one or more faces of the package. The lands are often arranged in rows parallel with and adjacent peripheral edges of one face with the surfaces of the lands coplanar and parallel with (but slightly below) the bottom surface of the package. The lands may be arranged in other patterns such as parallel rows which cover the entire bottom surface in a grid pattern; lands grouped near the center of the bottom surface; or various combinations of such arrangements. Such device packages (commonly known as land grid array or LGA packages) may thus be mounted on circuit patterns on the surface of a circuit board or the like so that the terminal lands are bonded to mating lands or pads on the board.

In many cases it is desirable that the completed device package be subjected to test and/or burn-in prior to acceptance and assembly onto a circuit board. While the terminal lands may be directly and permanently surface mounted on a circuit board by soldering, it is much more difficult to establish and maintain temporary electrical contact with each land without destroying or damaging the land, the package or the encapsulated device chip. In order to reliably test and burn-in such packages, the package must be temporarily mounted in a re-useable socket or mounting which makes precision interconnection between the input/output lands and outside circuitry without introducing signal distortion problems and without physically damaging the device package.

As the size of the package decreases and the number of lands increases, the size and spacing of lands become smaller. Smaller and more closely spaced lands are, of course, more difficult to contact with test probes or the like. Furthermore, long or massive contact pins cannot be used for connecting external circuitry to the input/output lands for testing when high frequency devices are involved because such contact pins, particularly when closely spaced in order to contact closely spaced lands, introduce unacceptable signal distortion.

Conventional burn-in and test apparatus employs test sockets mounted on a burn-in board with the pin-out leads of the test or burn-in socket passing through the bottom of the socket and through holes in a circuit board in conventional through-hole mountings. Interconnection of high frequency devices with outside circuitry using such conventional mountings can induce unacceptable signal distortion because of the high density of parallel terminal leads passing through the board.

Miniaturized surface mount device packages have now been devised which have very closely-spaced input/output terminal lands on one face of the package. Such device packages, because of their extremely small size, configuration and physical construction are most difficult to handle without causing damage, yet good electrical contact with all the input/output terminal lands is essential. It is therefore desirable that apparatus be devised in which such small packages may be easily temporarily mounted (preferably by automation) and tested and/or stress-tested by burn-in and the like without damaging the device package or introducing signal distortion problems.

In accordance with the present invention reliable precise electrical contact is provided between input/output lands on LGA packages and external circuitry by re-useable mounting apparatus which employs a support base, a guide plate and contact pins in the form of fingers which extend through guides in the guide plate to engage the input/output lands on an LGA package. The guide plate is formed of electrically insulating material and has a set of guides (such as holes or channels) arranged to correspond with the terminal land arrangement of the LGA package. The guide plate is supported on and spaced from a support base which has a set of guides arranged to correspond with input/output lands on external circuit media such as a circuit board, burn-in board or the like. An axially elongated contact pin or finger having first and second ends supported by a shank is positioned so that the first end of the contact finger extends through a guide in the guide plate and the second end of the contact finger extends through a guide in the support base to contact an input/output land on an external circuit board such as a burn-in board or the like. The shank of each contact finger extends through an aperture in a bending plate positioned intermediate the guide plate and the support base. When the bending plate is moved in a first direction with respect to the guide plate and support base, it bends the contact finger, thus drawing the ends of the fingers toward the bending plate. When moved in the opposite direction, the curvature of the fingers is decreased and the ends move outwardly through the guides in the guide plate and the support base. As the ends of the fingers move outwardly, they engage terminal lands on an LGA package mounted adjacent the guide plate and terminal lands on a circuit board or the like on which the support base is mounted. With the space between the lands on the LGA and the lands of the circuit board fixed by the size of the mounting apparatus, the contact pressure applied to the contact lands can be closely controlled by movement of the bending plate. Extending and retracting the ends of the contact fingers by bending the fingers also causes the ends of the fingers to move slightly laterally (in the direction opposite the direction of movement of the bending plate), thus causing the ends of the fingers to very slightly scrape the surfaces of the terminal lands to insure good electrical contact.

One end portion of each contact finger is supported in the guide plate and the other end portion supported in the support base. Each contact finger is constrained so that its ends may only move axially and are precisely aligned with the input/output land surfaces on the supporting board and device package under test. Since the ends of the contact fingers are constrained to move only axially, extremely small diameter contact fingers may be used to contact very small and closely spaced terminal lands. Since the contact fingers are very small and relatively short, they have very little mass. Capacitance-induced, inductance-induced and impedance-induced signal distortion are thus minimized. More significantly, the physical distance (the lead length) between the input/output land and the external circuitry to which it is connected by the contact pin is minimized. Thus the interconnection arrangement of the invention may be used for test and burn-in of extremely high frequency devices in packages employing very closely spaced terminal lands without introducing signal distortion problems. Because of the simplicity of design and operation, the socket devices of the invention may be made from a wide variety of available materials. Since the socket is loaded from the top, automated processes may be employed to load and unload the socket without damage to the device package or the socket and the top surface of the device package is exposed for cooling and/or attachment of a heat sink. Other features and advantages of the invention will become more readily understood from the following detailed description taken in connection with the appended claims and attached drawing in which:

Figure 1A:
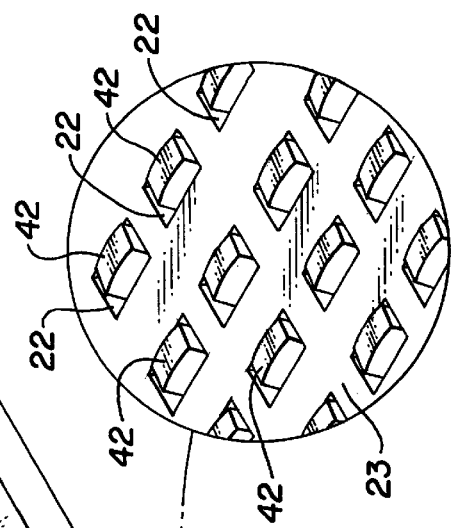
FIG. 1A is an exaggerated fragmentary view of the top surface of the mounting apparatus of FIG. 1.

The drawing is incorporated into and forms part of the specification to illustrate exemplary embodiments of the invention. For clarity of illustration, like reference numerals designate corresponding elements throughout the drawing. It will be recognized that the principles of the invention may be utilized and embodied in many and various forms. In order to demonstrate these principles, the invention is described herein by reference to specific preferred embodiments. The invention, however, is not limited to the specific forms illustrated and described. Furthermore, the invention is not limited to use in connection with LGA packages of the type illustrated in FIG. 1. Sockets employing the principles of the invention may be designed and used to mount, test and burn-in device packages employing any of a wide variety input/output terminal arrangements. LGA terminal lands may, for example, be arranged in multiple rows, in centralized groups or in a full grid array. In addition, the mounting socket may be designed to accommodate leaded device packages wherein the leads, at some point during fabrication, have a configuration in which the leads have a surface which may be contacted from the underside (such as leaded packages wherein the leads are held in a molded carrier ring). Sockets may also be designed to contact the underside of leads extending from dual inline packages, gull wing packages or various other packages before (or after) the terminal leads are formed into their final configuration. It is only necessary that the package under test presents a plurality of coplanar lands or terminal surfaces which may be directly contacted from the underside of the package by vertically extending ends of contact fingers which electrically connect circuitry on the surface of an external board and the terminal land or lead on the device package.

It should be understood that the invention is not limited to mounting only conventional encapsulated device packages. Input/output terminal lands are sometimes formed on bare chips or flip chip devices to form electrical interconnection with other chips or support media in multi-chip encapsulation packages. For example, a plurality of bare chips having terminal lands are sometimes mounted on a single support medium mounted within a single encapsulation package. It is often desirable to test these chips prior to assembly so that only "known good die" are ultimately mounted in the multi-chip arrangement. Such chips are characterized by having input/output lands on one face thereof and may be mounted in test sockets employing the principles of the invention. Accordingly, as used herein the term "LGA package" includes any package or chip, whether encapsulated or not, which employs a plurality of substantially coplanar input/output terminal lands or leads with surfaces extending in a plane substantially parallel with one face of the chip or package which may be physically contacted by the end of a contact pin or finger extending in a direction substantially normal to the plane of the surface of the terminal lands or leads. The terms "mounting apparatus" and "socket" are used synonymously herein to describe any device or apparatus for holding such LGA packages while providing electrical communication between its terminals and external circuitry such as a circuit board, burn-in board or the like.

Figure 1B:
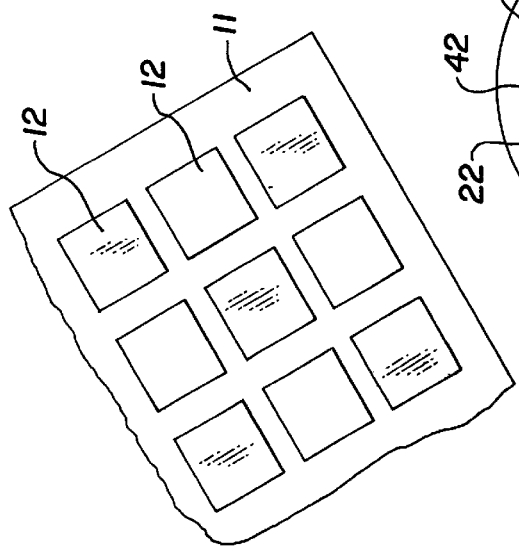
FIG. 1B is an exaggerated fragmentary view of the land grid array surface of the land grid array device package of FIG. 1.

A typical LGA package 10 having input/output terminal lands 12 arranged in a grid array on its bottom surface 11 is illustrated in FIG. 1B. The lands 12 are typically highly conductive metal such as gold or the like electrically connected with circuitry inside the package 10 and are arranged on the bottom surface 11 to be aligned in register with and soldered to corresponding lands, solder balls or the like on a circuit board or the like employing conventional surface mount technology. Various methods for forming such terminals are known and form no part of this invention. The number and arrangement of lands 12 will depend, of course, on the configuration and size of package 10 and the chip or the chips encapsulated therein. As the density of lands 12 on the surface increases, the lands become smaller and the spacing between lands decreases. Obviously, making reliable temporary electrical contact to the surfaces of closely spaced lands requires extremely small contact pins which must be maintained in precision alignment.

Figure 1:
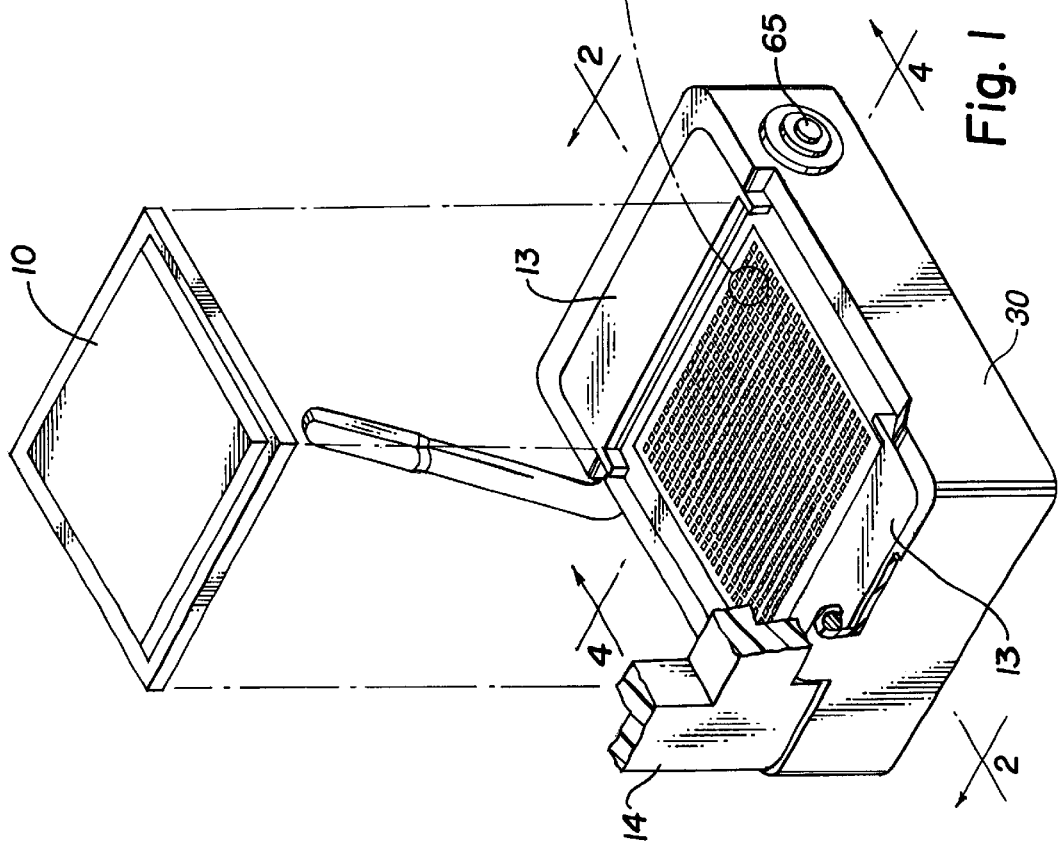
FIG. 1 is an exploded perspective view of the assembly of a land grid array device package with a preferred embodiment of the mounting of the invention.

Operational arrangement of an LGA package 10 with the preferred embodiment of the mounting of the invention is illustrated in FIG. 1. The device package 10 has a bottom face 11 (see FIG. 1B) on which are formed a plurality of terminal lands 12. The LGA package 10 is positioned on or parallel with the top face of guide plate 21 in housing 30 and positioned so that the contact surface of each terminal land 12 is aligned in register with an aperture 22 in guide plate 21. Adjustable alignment templates 13 may be used to accommodate various sizes and shapes of packages 10 and align the lands 12 with apertures 22. A hinged lid 14 or other conventional closure mechanism is used to secure the LGA package 10 in fixed relationship with the top surface of guide plate 21.

In the embodiment illustrated guide plate 21 and support base 25 are supported in a housing 30 in fixed spaced relationship with each other. Guide plate 21 has plurality of apertures 22 extending therethrough from its first surface 23 to its second surface 24 which act as guides for the contact fingers 40. Support base 25 has corresponding guides 26 extending therethrough from its inner surface 27 to its outer surface 28. The guide plate 21 and support base 25 are supported in housing 30 in spaced apart parallel relationship so that inner surface 27 of support base 25 is spaced from second surface 24 of the guide plate. Apertures 22 in guide plate 21 and apertures 26 in support base 25 are aligned in fixed relationship with each other. In the embodiment illustrated the apertures 22 in guide plate 21 are directly aligned with apertures 26 in support base 25. However, direct corresponding alignment is not necessary so long as a direct relationship is maintained between each pair of guides 22, 26.

Figure 4:
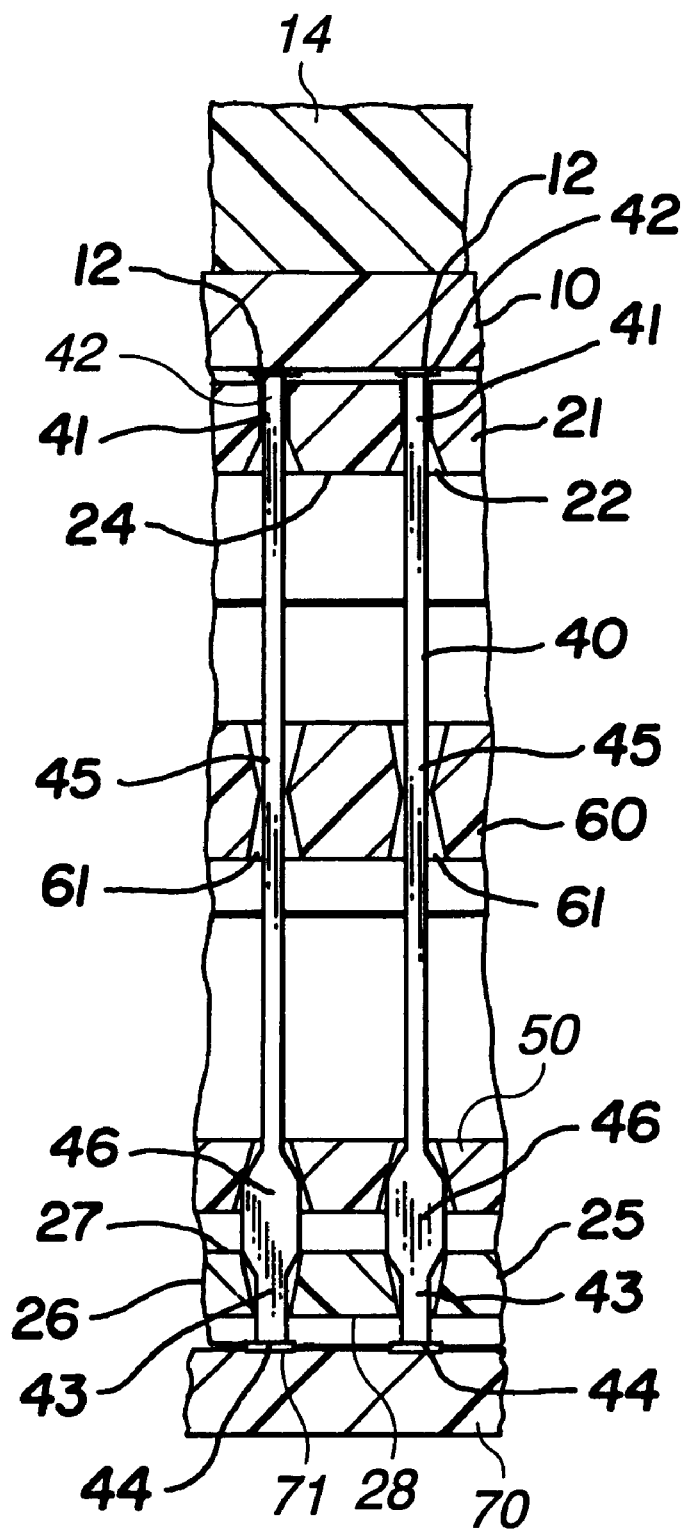
FIG. 4 is a partial sectional view of the mounting of FIG. 1 taken along lines 4—4 of FIG. 1.

An elongated contact pin or finger 40 is supported in each pair of guides 22, 26 so that the end portion 41 adjacent first end 42 is positioned an guide 22 and the end portion 43 adjacent second end 44 is positioned within corresponding guide 26. First end portion 41 and second end portion 43 are connected by an elongated central portion or shank 45. A widened tab 46 (see FIG. 4) adjacent second end portion 43 is loosely confined between the inner surface 27 of support base 25 and a trap plate 50 which is parallel with and spaced from inner surface 27 of support base 25. Trap plate 50 has a plurality of apertures 51 therein aligned with guides 26 in support base 25. The apertures 51 and guides 26 are dimensioned so that shank 45 and second end portion 43 pass readily by therethrough but prevent passage of tab 46. The surface of trap plate 50 is spaced from inner surface 27 of support base 25 to loosely trap tab 46 therebetween. Thus axial movement of contact finger 40 is limited so that the first end portion 41 cannot be fully withdrawn from guide 22 in the guide plate 21 and the second end portion 43 cannot be fully withdrawn from guide 26. End portions 41 and 43 may move axially within guides 22 and 26, respectively, but axial movement is limited and the dimensions of the guides 22, 26 prevent other movement of the contact finger 40.

A bending plate 60 is supported between and parallel with guide plate 21 and support base 25. Bending plate 60 has an arrangement of apertures 61 therein which corresponds with the arrangement of guides 22 in guide plate 21 and guides 26 in support base 25. Bending plate 60 is positioned so that the shank 45 of each contact finger 40 may pass directly through an aperture 61. However, bending plate 60 is mounted for lateral movement in a plane parallel with second surface 24 of guide plate 21 and inner surface 27 of support base 25 in response to rotation of cam 65.

Figure 2:
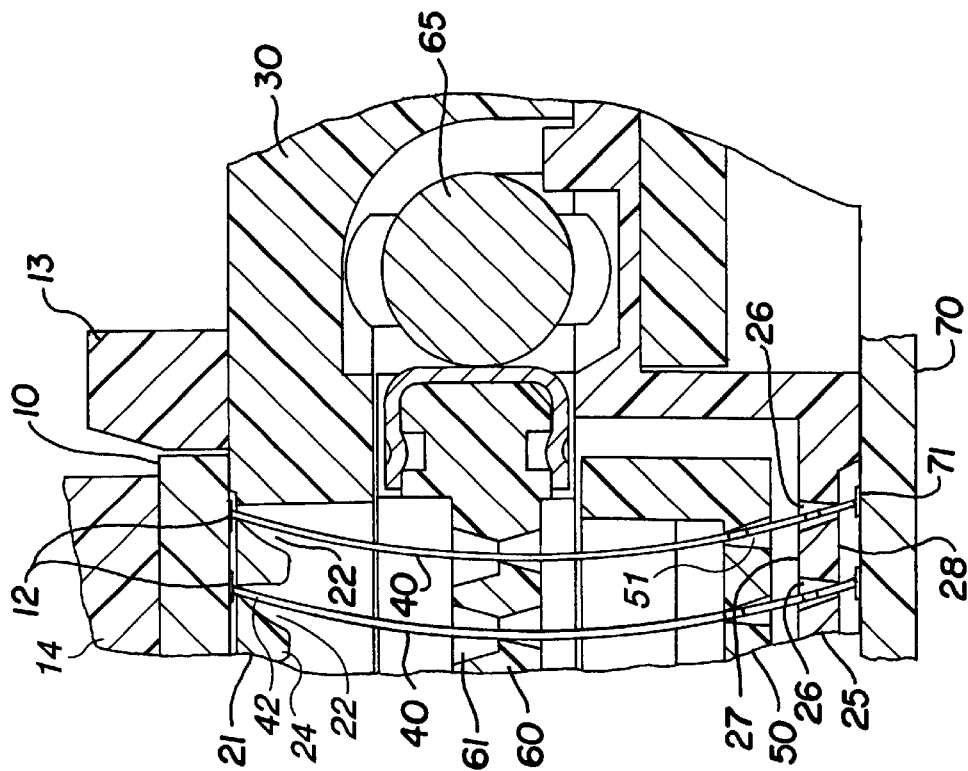
FIG. 2 is a partial sectional view of the mounting apparatus of FIG. 1 taken along line 2—2 showing the position of the contact fingers when the mounting apparatus is in the open condition.

As shown in FIG. 2 the ends 42, 44 of contact finger 40 are drawn inwardly (toward bending plate 60) when cam 65 is rotated to engage lobe 66 with the end of bending plate 60 and move the bending plate laterally (to the left as shown in FIG. 2). This bends the fingers 40 into a curve and reduces the distance between ends 42, 44 to position the fingers 40 in the "open" position.

Surface mounting of test and burn-in sockets can minimize signal distortion resulting from cross-talk, reactive capacitance, etc., by spreading the interconnection circuitry across the surface of the board and reducing parallel lead lengths. Accordingly, mounting 30 is mounted directly on the surface of a circuit board 70, burn-in board or the like which has surface mount contact pads 71 on the surface thereof arranged in a pattern corresponding to the pin-out footprint of the LGA package. The mounting 30 thus provides direct contact between pads 71 on the board and lands 12 on the LGA package. It will be appreciated, of course, that mounting 30 may be designed to spread the second ends 44 so that the pin-out footprint is enlarged.

Figure 3:
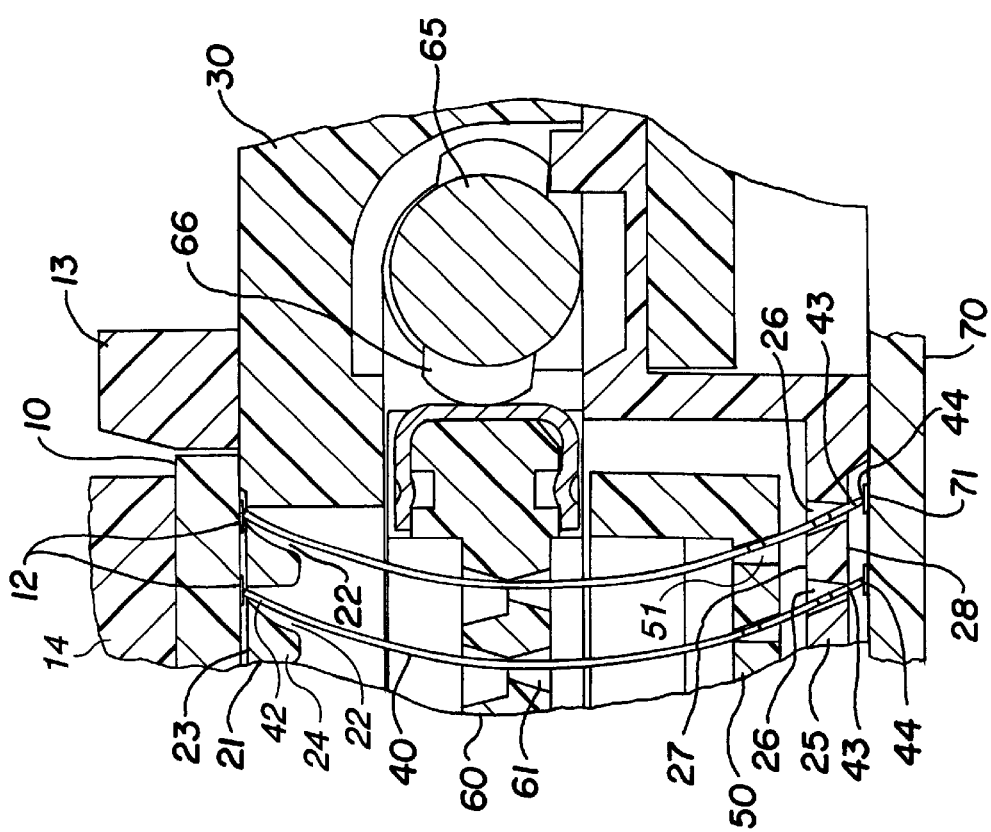
FIG. 3 is a partial sectional view of the mounting of FIG. 1 taken along line 2—2 showing the position of the contact fingers when a land grid array package has been inserted in a socket and the socket is in the closed position.

With the mounting 30 mounted on a board 70, an LGA package is positioned adjacent the top surface of guide plate 21 with its lands 12 aligned in register with guides 22 in guide plate 21. With cam 65 rotated so that lobe 66 urges bending plate 60 to the left as shown in FIG. 2., the ends 42, 44 of contact fingers 40 are aligned with but slightly spaced from lands 12 and pads 71, respectively. The mounting socket is closed by rotating cam 65 so that bending plate 60 moves in the opposite direction (to the right as shown in FIG. 3). The bending plate may be moved to the closed position by any suitable means such as springs (not shown) or cams such as cam 65. With proper choice of materials, the fingers 40 may have sufficient memory to move the bending plate 60 in returning to the relaxed (unbiased) position. As the bending plate 60 moves to the right as shown in FIG. 3., the ends 42, 44 move outwardly and, guided by guides 22, 26, engage the faces of lands 12 and pads 71, respectively.

It should be noted that as the ends 42, 44 move outwardly, they also move very slightly laterally because the curvature of fingers 40 is reduced. The ends 42, 44 thus lightly scrape the surfaces they engage to remove any oxides and assure good electrical contact with the contact finger 40. Although the bending plate 60 moves all the fingers 40 simultaneously, the pressure exerted by each finger is independent of the other fingers. By selection of the composition, size, shape, etc., of the fingers 40 and control of movement of the bending plate 60, the pressure exerted at the contact ends 42, 44 of each contact finger may be precisely controlled.

In the embodiment illustrated, fingers 40 are thin flat ribbons or strips and guides 22, 26 are correspondingly-shaped and sized apertures which limit movement of the contact fingers therethrough to axial movement only. It will be readily recognized, however, that both the fingers 40 and guides 22, 26 may take other shapes so long as the guides 22, 26 control the direction of movement of the ends of the fingers 40.

In the preferred embodiment illustrated, the bending plate 60 is positioned approximately midway between the guide plate 21 and the support base 25 and is moved laterally with respect to the guide plate and the support base. It will be readily recognized, however, that other arrangements will produce similar results. For example, the bending plate 60 and either the guide plate 21 or support base 25 could held stationary and the other moved with respect thereto. Similarly, the function of the trap plate 50 may be performed by the bending plate 60 if the tabs and the bending plate are appropriately sized and positioned.

It will be recognized that all components of the mounting apparatus of the invention may be fabricated from readily available materials using conventional techniques. Of course, when the mounting apparatus is to be used as a burn-in socket, materials must be chosen which will withstand the temperatures involved as well as repeated usage. It will also be recognized that loading and unloading of device packages 10 may readily be automated using conventional techniques.

Likewise, while the embodiment illustrated employs templates 13 and lid 14 to orient and hold an LGA package of the type shown in FIG. 1 with respect to the guide plate 21, various other structures may be employed to receive other types of packages or chips such as bare die, flip chips, etc., and leaded packages configured to be an LGA package as that term is defined herein.

It will be apparent from the foregoing that the principles of the invention may be used to mount and form temporary electrical contact with the terminal leads or lands of various device packages without risk of damaging the device or its input/output terminals. Because of the unique structure, mounting apparatus employing the invention may be used for burn-in and/or test of high frequency devices without concern for signal distortion introduced by the test socket or its interconnection with the burn-in board or other support media. It is to be understood, however, that even though numerous characteristics and advantages of the invention have been set forth in the foregoing description together with details of the structure and function of various embodiments, this disclosure is to be considered illustrative only. Various changes and modifications may be made in detail, especially in matters of shape, size, arrangement and combination of parts, without departing from the spirit and scope of the invention as defined by the appended claims.

What is claimed:

1. Apparatus for mounting an LGA package having a plurality of terminal lands or leads with surfaces extending in a plane substantially parallel with one face of the LGA package comprising:
    (a) a guide member having oppositely disposed first and second faces and a plurality of guides extending there through from said first face to said second face and arranged to correspond with terminal surfaces on an LGA package;
    (b) a support base having oppositely disposed inner and outer major faces and a plurality of guides extending there through from said inner face to said outer face supported in spaced relationship with said guide member so that said inner face is substantially parallel with and spaced from said second face of said guide member with the guides in said support base arranged to correspond with the guides in said guide member;
    (c) a bending plate having apertures therein substantially corresponding with the guides in said guide member positioned between said guide member and said support base and adapted for lateral movement with respect to at least one of said support base and said guide member;
    (d) a plurality of axially elongated contact fingers, each having a first free end, a second free end and an elongated shank extending between said first free end and said second free end, with the portion of said shank adjacent said first free end positioned in and constrained by a guide in said guide plate, the portion of said shank adjacent said second free end positioned in and constrained by a guide in said support base, and said shank passing through an aperture in said bending plate; and
    (e) means for moving said bending plate laterally with respect to at least one of said support base and said guide member to bend each contact finger, thereby increasing or decreasing the distance between said first free end and said second free end of each of said contact fingers.

2. Apparatus as defined in claim 1 including means for limiting axial movement of said contact fingers.

3. Apparatus as defined in claim 1 including means for securing an LGA package adjacent said first face of said guide member.

4. Apparatus as defined in claim 3 including
    (i) an LGA package secured adjacent said first face of said guide member; and
    (ii) a circuit board with circuit pads on at least one face thereof secured adjacent said outer face of said support base with said contact pads aligned with said guides in said support base.

5. Apparatus as defined in claim 1 wherein said means for moving said bending plate is a cam.

6. Apparatus as defined in claim 1 wherein said bending plate and said support base are fixed with respect to each other and said guide plate is moveable laterally with respect thereto.

7. Apparatus as defined in claim 6 wherein the functions of said bending plate and said support base are performed by a single structure.

8. Apparatus as defined in claim 1 wherein said bending plate and said guide plate are fixed with respect to each other and said support base is moveable laterally with respect thereto.

9. Apparatus as defined in claim 1 including
    (i) a trap plate positioned between said guide member and said base support having apertures therein arranged to correspond with the guides in said guide member and said support base; and
    (ii) tabs on said contact fingers positioned between said trap plate and said support base which will not pass through the apertures in said trap plate.

10. Mounting apparatus for an LGA package comprising:
    (a) a support base having a plurality of guide apertures extending there through;
    (b) a guide plate spaced from said support base and having guide apertures extending there through which correspond with the guide apertures in said support base;
    (c) a plurality of contact fingers having first and second free end portions suspended between said support base and said guide plate with the first free end portions thereof positioned in and constrained by a guide apertures in said guide plate and the second free end portions thereof positioned in and constrained by guide apertures in said support base; and
    (d) means for bending said contact fingers, thereby increasing or decreasing the distance between the free ends thereof.

11. The method of establishing electrical contact between terminal lands on an LGA package and circuit pads on a circuit board or the like comprising the steps of:
    (a) supporting an LGA package with input/output terminal lands spaced from a circuit board with circuit pads corresponding to said input/output terminal lands on said LGA package,
    (b) securing a mounting between said LGA package and said circuit board which has
        (i) a support base with guide apertures therein adjacent said circuit board with said guide apertures aligned in register with said circuit pads;
        (ii) a guide plate with guide apertures therein aligned in register with the terminal lands on said LGA package; and
        (iii) contact fingers, each having a first free end portion and a second free end portion, suspended between said guide plate and said support base with the first free end portion of each contact finger moveably mounted in and constrained by a guide aperture in said guide plate and the second free end portion of said contact finer moveably mounted in and constrained by a guide aperture in said support base; and (c) alternatively bending said contact fingers in a first direction to decrease the distance between the ends thereof and bending said contact fingers in a second direction to increase the distance between the ends thereof and urge one end of each contact finger into contact with an input/output terminal land on said LGA package and the opposite end of each contact finger into contact with a circuit pad on said circuit board.

* * * * *